United States Patent [19]
Liu et al.

[11] Patent Number: 5,897,342
[45] Date of Patent: Apr. 27, 1999

[54] MULTILAYER INTERCONNECTION TECHNIQUE

[75] Inventors: Chun-Sheng Liu, Tainan; Chen-Chung Hsu, Taichung; Tsuy-Hua Huang, Hsin-Chu, all of Taiwan

[73] Assignee: United Microelectronics Corp., Taiwan

[21] Appl. No.: 08/752,212

[22] Filed: Nov. 19, 1996

Related U.S. Application Data

[60] Provisional application No. 60/010,761, Jan. 29, 1996.

[51] Int. Cl.[6] .................................................... H01L 21/82
[52] U.S. Cl. ............................................ 438/128; 438/129
[58] Field of Search ...................................... 438/128, 129

[56] References Cited

U.S. PATENT DOCUMENTS

| | | | |
|---|---|---|---|
| 4,582,563 | 4/1986 | Hazuki et al. | 156/643 |
| 5,204,286 | 4/1993 | Doan | 437/195 |
| 5,279,988 | 1/1994 | Saadat et al. | 437/195 |
| 5,493,152 | 2/1996 | Chang | 257/758 |
| 5,610,100 | 3/1997 | Kurino et al. | 437/195 |

*Primary Examiner*—John Goodrow
*Attorney, Agent, or Firm*—Rabin & Champagne,P.C.

[57] ABSTRACT

A multilayer wiring structure consists of a substrate with a first set of wiring lines formed thereon. A first insulating layer covers the first set of wiring lines, a second insulating layer covers the first set of wiring lines and then a second set of wiring lines are formed on the second insulating layer. Vias are formed through the second insulating layer, the second wiring lines and the first insulating layer extending down to the surface or near the surface of the first wiring lines. Metallizations fill the vias to form connections and interconnections to and between the first wiring lines, the second wiring lines and the surface of the semiconductor device. Additional wiring lines may be formed on the surface of the second insulating layer and in contact with the metallizations.

12 Claims, 4 Drawing Sheets

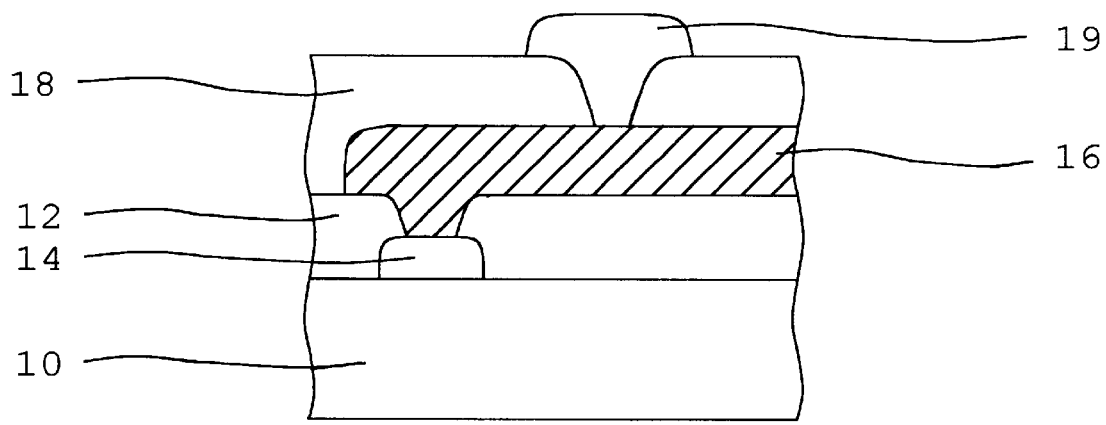
FIG. 1 - Prior Art
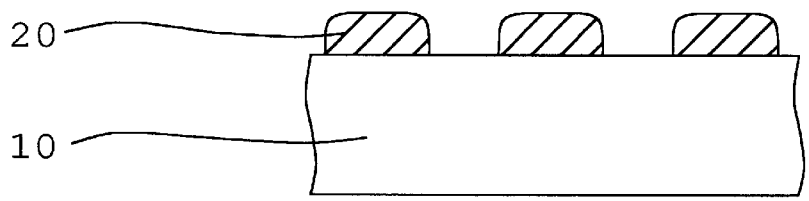
FIG. 2
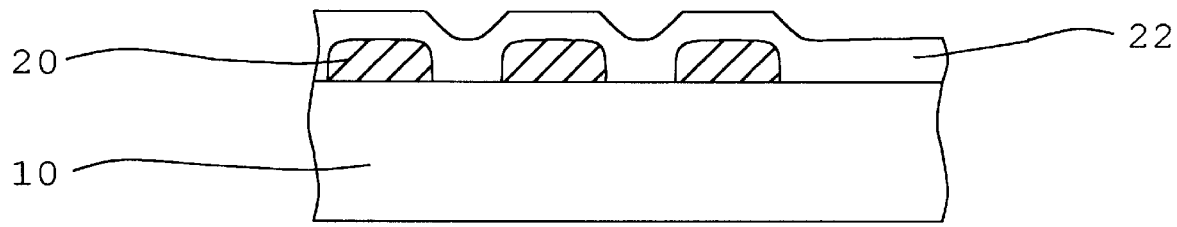
FIG. 3

MULTILAYER INTERCONNECTION TECHNIQUE

This application claims priority from provisional application Ser. No. 60/010,761, filed Jan. 29, 1996.

BACKGROUND OF THE INVENTION

1. Field of the Invention

This invention relates to a process for forming a semiconductor device and, more particularly, to a process for forming multilayer metal systems and multilayer interconnections.

2. Description of the Related Art

Multilayer interconnections are an important feature of large scale integrated circuits. It is common in large scale integrated circuits to make connections between devices or between devices and external contacts through a series of wiring lines formed on different levels of a device. Thick layers of insulating material physically and electrically separate wiring lines on different levels of the device. Connections between wiring lines on different levels are formed through relatively narrow openings formed in the insulating layer that separates the wiring lines on different levels. Multilayer wiring structures are unavoidable in current integrated circuit designs, since it is presently the only way in which the many interconnections necessary to a semiconductor circuit can be made. On the other hand, multilayer wiring structures can be difficult to manufacture, since many careful alignment steps must be performed to successfully complete the wiring structure.

FIG. 1 illustrates a semiconductor device incorporating such a multilayer wiring structure. Wiring line 14, which may include one or more metals, alloys, suicides of metals or polysilicon, is formed on the surface of a substrate 10. The substrate 10 may be a silicon chip having a device formed therein, with the wiring line 14 formed on the surface of the silicon chip or the wiring line can be formed on an insulation layer on the surface of the silicon chip. Insulating layer 12 is deposited on the substrate 10 and over the wiring line 14, and then a via is formed through the insulating layer 12 to expose a portion of the first level wiring line 14. A second level wiring line 16 is then deposited on the insulating layer 12 so as to extend into the via, making contact with the first level wiring line within the via. Another insulating layer is deposited on the surface of the first insulating layer 12 and covering the second level wiring line 16. A via is formed in the second insulating layer 18, and a third level wiring line 19 is formed on the surface of the second insulating layer 18 so as to make contact with the second level wiring line 16 through the via. In this way, electrical connection is established between the first level wiring line 14 and the third level wiring line 19.

The process used to form the structure illustrated in FIG. 1 relies on the use of a series of critical alignment steps, including the positioning of a first level via mask in proper registration with first level wiring line 14. Subsequently, a second level conductive layer is patterned to define second level wiring line 16 so that the wiring line extends through the first level via to make contact with the first level wiring line 14. Another alignment step is required to properly position a second level via mask on the second insulating layer 18 in proper registration with the second level wiring line 16. Each of the masking steps in this process is subject both to errors in mask formation and to errors in mask alignment. Sufficient errors in mask formation can reduce the yield of the semiconductor device, and may require the production of a new mask. Errors in mask alignment can also reduce the yield of the semiconductor device, with a fraction of all wafers being rendered defective at each mask alignment step. It would therefore be desirable to reduce the number of mask alignment steps required in the formation of a semiconductor device, particularly those mask alignments that relate to the formation of non-self aligned structures such as vias. In addition, using fewer masks provides the additional benefit of shorter cycle time, since less time is occupied by the process of aligning masks.

SUMMARY OF THE PREFERRED EMBODIMENTS

One embodiment of the present invention provides a method of forming a device including a multilayer wiring structure. A plurality of first conductive members are formed on a substrate and a first insulating layer is formed over the plurality of first conductive members. A plurality of second conductive members are formed on the first insulating layer so that the second conductive members overlie at least some of the first conductive members. A second insulating layer is formed over the plurality of second conductive members. Next, a plurality of first vias are formed through the second insulating layer and through the first insulating layer, at least some of the first vias passing through ones of the second conductive members and at least some of the first vias passing through ones of the first conductive members. A plurality of first metal interconnects are then formed within the first vias.

A further aspect of this embodiment forms a plurality of third conductive members on the second insulating layer so as to contact one or more of the first metal interconnects. Furthermore, a third insulating layer may be formed over the plurality of third conductive members and the second insulating layer. Then a plurality of second vias are formed through the third insulating layer, the second insulating layer and the first insulating layer, at least some of the second vias passing through ones of the second conductive members and at least some of the second vias passing through ones of the first conductive members metallizations are formed within the plurality of second vias.

A different embodiment of the present invention provides a method of forming a semiconductor device including a multilayer wiring structure, where a plurality of first wiring lines are formed on or above a semiconductor substrate, wherein the first wiring lines make contact to one or more devices formed in the semiconductor substrate. A first insulating layer is formed over the plurality of first wiring lines and over the semiconductor substrate. A plurality of second wiring lines are formed on or above the first insulating layer, the second wiring lines overlying at least some of the first wiring lines. Then, a second insulating layer is formed over the plurality of second wiring lines and over the first insulating layer. A plurality of first vias are formed through the second insulating layer and through the first insulating layer, at least some of the first vias passing through ones of the second wiring lines and through ones of the first wiring lines and then a plurality of first metal interconnects are formed within the first vias.

BRIEF DESCRIPTION OF THE DRAWINGS

Aspects of the present invention are described and can best be understood with reference to the drawings. It should be noted that the drawings are merely schematic and show only portions of the complete device.

FIG. 1 schematically illustrates a conventional multilayer wiring structure.

FIGS. 2–7 schematically illustrate steps in the process of making a multilayer wiring structure in accordance with the present invention.

DETAILED DESCRIPTION OF THE PREFERRED EMBODIMENTS

Conventional wiring structures are formed by repeating a sequence of processing steps including the formation of a lower level wiring line, covering the lower level wiring line with an insulating layer, forming a via through the insulating layer and forming an upper level wiring line in contact with the lower level wiring line through the via. This process is repeated for each successive level of wiring lines. Certain embodiments of the present invention do not form vias through each successive insulating layer as it is formed. Rather, these embodiments of the present invention form multilayer structures of wiring lines separated by thick insulating layers and then form vias through the several layers of the multilayer wiring structure. Metallizations are formed within the vias to interconnect wiring lines on different levels. In this way, interconnections between wiring lines can be formed using at least one fewer mask than in the conventional process, resulting in higher yields and faster throughput. In particularly preferred embodiments, the resulting wiring structure includes vertically extending columns of metal extending through a plurality of wiring lines on different levels.

A method of making a multilayer interconnection in accordance with the present invention is illustrated in FIGS. 2–7. Referring first to FIG. 2, a set of wiring lines 20 are formed on the surface of a substrate 10. The substrate may consist of a silicon chip, and the wiring lines 20 may be in direct contact with the silicon chip or they may contact the silicon chip at one or more positions located remote from the particular position illustrated in cross-section in FIG. 2. Wiring lines 20 may consist of a single, uniform layer of one material or may consist of several layers of different materials. Typical materials for the first level wiring lines 20 include polysilicon, refractory metals such as titanium, silicides of refractory metals, titanium nitride, and aluminum and aluminum alloys. Often, the wiring lines have feature sizes on the order of 3000 Å to 6000 Å.

Figure 4:
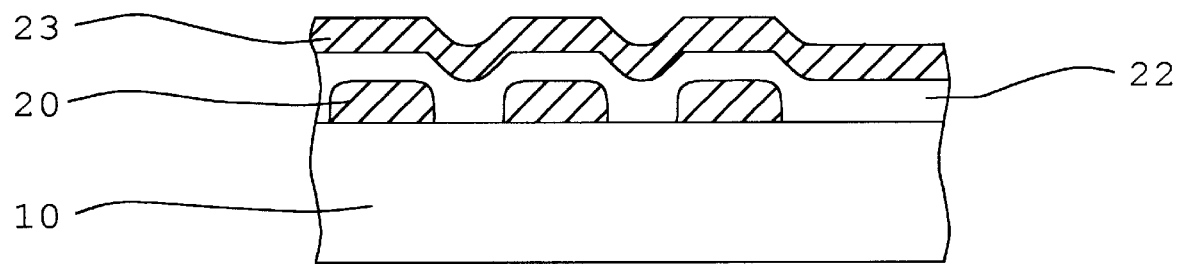
Figure 5:
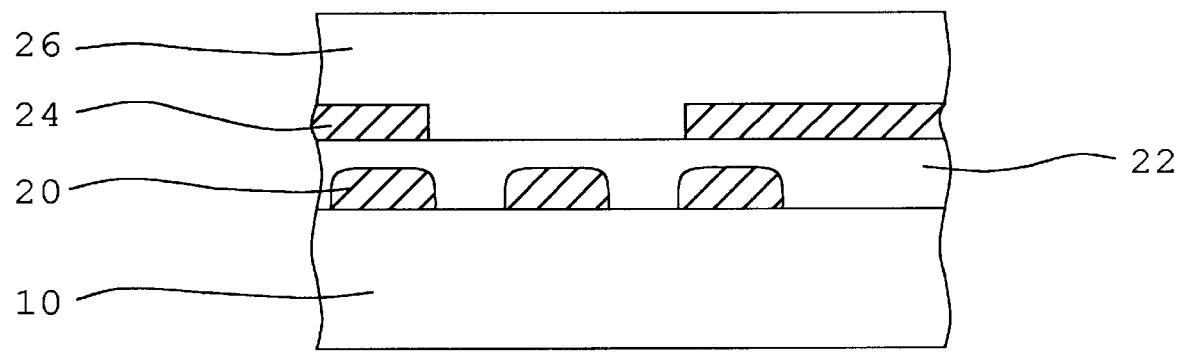
Figure 6:
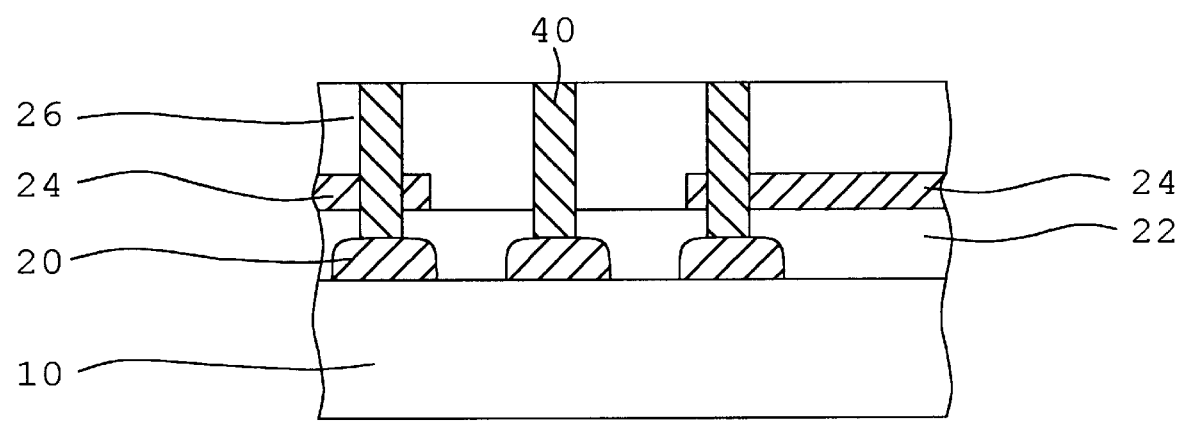

A first insulating layer 22 is formed over the first level wiring lines 20, as shown in FIG. 3. Insulating layer 22 typically comprises a silicon oxide or a spin-on-glass (SOG) and is generally deposited by one of the chemical vapor deposition (CVD) techniques to a thickness between 4000 Å and 8000 Å. A layer of conductive material 23, preferably a metal, is formed over the first insulating layer 22 (FIG. 4) and is patterned to form a set of second level wiring lines 24 (FIG. 5). Like the first level wiring lines 20, the second level wiring lines can be made as layered structures from a variety of conductive materials to have a thickness of between about 3000 Å to 6000 Å. A second insulating layer is deposited on the surface of the device to cover the second level wiring lines 24 (FIG. 4). The second insulating layer may generally be of similar composition and deposited in a similar manner to the first insulating layer. Alternately, the second insulating layer can be a three layer structure consisting of a bottom dielectric layer, a spin-on-glass layer and an top dielectric layer having a total thickness between about 4000 Å and about 8000 Å. For example, the bottom dielectric layer can be between about 2000 Å and 3500 Å of silicon oxide, the spin-on-glass layer can have a thickness between about 2000 Å and 2500 Å, and the top dielectric layer can be silicon oxide having a thickness between about 2500 Å and 4500 Å, to have a total thickness of between about 4000 Å and 8000 Å.

Referring now to FIG. 5, vias are formed through the multilayer wiring structure of FIG. 4, extending through the second insulating layer 26, through selected ones of the second level wiring lines 24, through the first insulating layer 22 and exposing a contact region at or near the surface of the first level wiring lines 20. As illustrated in FIG. 5, vias can be formed through both the second insulating layer 26 and the first insulating layer 22 to allow the formation of a contact to a selected one of the first level wiring lines 20. Vias can also be formed to pass through a second level wiring line 24, extending through the first insulating layer 22 to expose a portion of a selected one of the first level wiring lines 20 so that interconnections can be made between the first and second level wiring lines. Preferably, the vias have a diameter of between about 0.5 μm to 0.7 μm and, more preferably, the vias have a diameter of about 0.6 μm. The exact diameter of the vias is largely determined by the depth of the via and the characteristics of the conductive material that is used to fill the vias.

Figure 7:
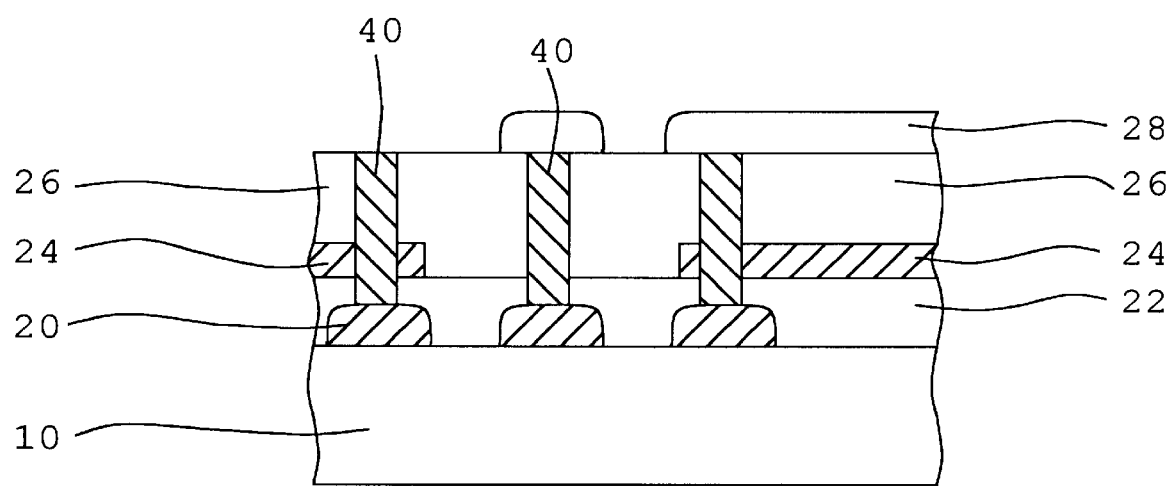

Metal interconnects 40 are then formed within the vias by depositing a metal such as tungsten or aluminum over the surface of the device and etching the excess metal from the surface of the second insulating layer 26 to form the structure as illustrated in FIG. 7. The metal can be deposited by, for example, RF or DC sputtering. Typically the metal interconnects are between about 0.8 μm to 1.5 μm in height, and preferably the height of the interconnects is about 1.2 μm. After the metal interconnects 40 are formed and excess metal has been removed from the surface of the second insulating layer 26, a third level of wiring lines (or contact pads) can be formed on the surface of insulating layer 26, with at least some of the third level interconnects being coupled to the metal interconnects 40. The third level lines 28 are formed in the conventional manner to a thickness of, for example, about 6000 Å to about 12,000 Å and may consist of titanium, titanium nitride, aluminum, other metals, or multiple layers of metals.

By proper selection of via location, and by proper design of the wiring paths on the first and second levels of wiring lines, vertical vias extending from the second insulating layer down to the first wiring lines 20 can provide all the interconnection paths that are necessary to the completion of the two-level wiring structure of the FIG. 7 device. As illustrated in FIG. 7, interconnections can be made which (from left to right in FIG. 7): Interconnect a first level wiring line to a second level wiring line without forming a connection to a third level wiring line; interconnect a first level wiring line to a third level wiring line without forming a connection to a second level wiring line; and interconnect a first level wiring line to both a second and a third level wiring line.

Figure 8:
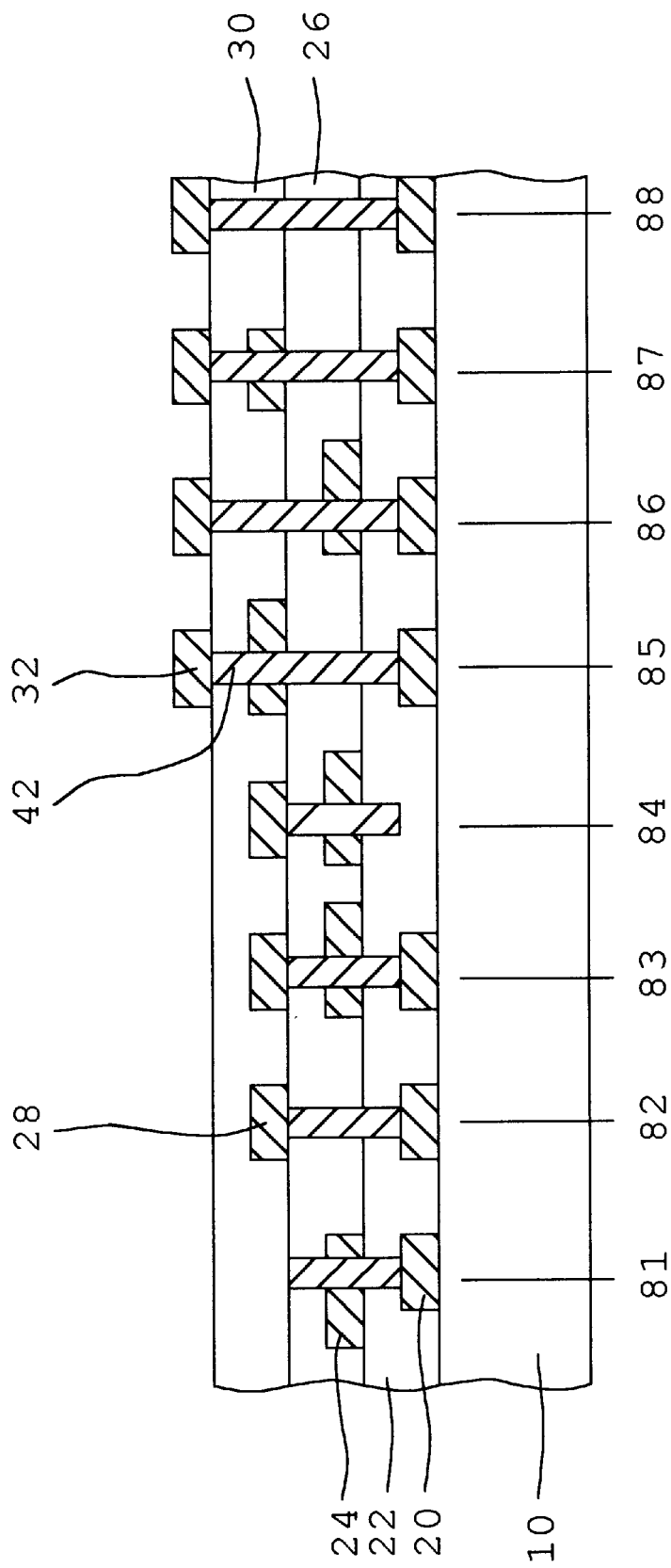
FIG. 8 schematically illustrates a four-layer wiring system in accordance with the present invention.

The present invention can also be applied to multilayer wiring structures that include more than three wiring layers. FIG. 8 shows a structure having four levels of wiring which illustrates two different aspects of the present invention. The left half of the structure, including the metal interconnects indicated by numbers 81–84, is formed in the manner used to form the structure of FIG. 7 and a third insulating layer 30 is deposited over the third level wiring lines 28. Further structures can then be formed above the third insulating layer 30, if desired. The right hand side of the FIG. 8 structure, including the interconnects indicated by numbers 85–88, illustrates a different strategy for implementing a four level wiring structure. The structure illustrated on the right-hand side of the FIG. 8 structure can be used in conjunction with the three level structure illustrated on the lefthand side of the FIG. 8 structure, or all of the interconnections illustrated in FIG. 8 can be made using the four level wiring structure illustrated on the right-hand side of the FIG. 8 structure (interconnections 85–88).

The four level wiring structure on the right-hand side of FIG. 8 is formed as follows. First level wiring lines 20 are formed on the substrate 10. A first insulating layer 22 is formed over the first level wiring lines 20 and second level wiring level 24 is formed on the first insulating layer 22. A second insulating layer 26 covers the second level wiring lines, third level wiring lines 28 are formed on the surface of the second insulating layer 26 and a third insulating layer 30 is formed over the third level wiring lines 28. Vias are formed through the third insulating layer 30, through selected ones of the third level wiring lines 28, through the second insulating layer 26, through selected ones of the second level wiring lines 24, through the first insulating layer 22 and extending to selected ones of the first level wiring lines 20. Metallizations 42 are formed in the vias so as to interconnect selected wiring lines on different levels, and then fourth level wiring lines 32 are formed to contact the metallizations 42. By appropriate selection of via location and proper design of the wiring paths on different levels, all of the interconnections necessary to completing the illustrated semiconductor circuit can be formed in the manner illustrated in FIG. 8.

Various devices including MOSFETs, bipolar transistors, other active devices and various passive devices can be formed in the substrate 10 and contacts and interconnections can be formed using wiring structures made in accordance with the present invention. Use of embodiments of the present invention allows contacts to be formed using fewer via masks, which reduces the yield losses associated with mask misalignments and reduces processing cycle time.

While the present invention has been described with particular reference to certain preferred embodiments thereof, it will be understood by those skilled in the art that various changes and modifications might be made to these embodiments within the scope of the present invention. Accordingly, the scope of the present invention is not to be limited to the particular embodiments described herein, but is instead to be determined by the claims which follow.

What is claimed:

1. A method of forming a device including a multilayer wiring structure, comprising:

forming a plurality of first conductive members on a substrate;

forming a first insulating layer over the plurality of first conductive members;

forming a plurality of second conductive members on the first insulating layer, the second conductive members overlying at least some of the first conductive members;

forming a second insulating layer over the plurality of second conductive members;

forming a plurality of first vias through the second insulating layer and through the first insulating layer, at least some of the first vias passing through ones of the second conductive members and at least some of the first vias passing through ones of the first conductive members; and forming a plurality of first metal interconnects by depositing a conductive material including tungsten or aluminum directly over and in contact with a surface of the second insulating layer and within the first vias directly contacting walls of the vias.

2. The method of claim 1, further comprising the step of forming a plurality of third conductive members on the second insulating layer so as to contact one or more of the first metal interconnects.

3. The method of claim 1, wherein the first metal interconnects form interconnections between at least one first conductive member and at least one second conductive member.

4. The method of claim 3, further comprising the step of forming a contact above the substrate, wherein a connection between the contact and one of the first conductive members passes through one of the first metal interconnects.

5. The method of claim 1, wherein the step of forming a plurality of first metal interconnects comprises the steps of sputtering tungsten over the surface of the second insulating layer and within the first vias and removing the excess tungsten from the surface of the second insulating layer.

6. The method of claim 2, further comprising:

forming a third insulating layer over the plurality of third conductive members and the second insulating layer;

forming a plurality of second vias through the third insulating layer, the second insulating layer and the first insulating layer, at least some of the second vias passing through ones of the second conductive members and at least some of the second vias passing through ones of the first conductive members;

forming a plurality of second metal interconnects by depositing a conductive material including tungsten or aluminum directly over and in contact with a surface of the third insulating layer and within the plurality of second vias directly contacting walls of the vias.

7. The method of claim 1, wherein the first vias extend only to a level at or near an upper surface of the first conductive members.

8. A method of forming a semiconductor device including multilayer wiring structure, comprising:

forming a plurality of first wiring lines on or above a semiconductor substrate, wherein the first wiring lines makes contact with one or more devices formed in the semiconductor substrate;

forming a first insulating layer over the plurality of first wiring lines and over the semiconductor substrate;

forming a plurality of second wiring lines on or above the first insulating layer, the second wiring lines overlying at least some of the first wiring lines;

forming a second insulating layer over the plurality of second wiring lines and over the first insulating layer, forming a plurality of first vias through the second insulating layer and through the first insulating layer, at least some of the first vias passing through ones of the second wiring lines and through ones of the first wiring lines; and forming a plurality of first metal interconnects by depositing a conductive material including tungsten or aluminum directly over and in contact with a surface of the second insulating layer and within the first vias directly contacting walls of the vias.

9. The method of claim 8, wherein the first metal interconnects are formed so as to couple the devices formed within the semiconductor substrate to upper conductors lying on the surface of the semiconductor device.

10. The method of claim 8, further comprising:

forming a plurality of third wiring lines over the second insulating layer, the third wiring lines overlying at least some of the second wiring lines;

forming a third insulating layer over the plurality of third wiring lines; and forming a plurality of second vias through at least the third insulating layer, forming some of the second vias through the first insulating layer and the second insulating layer, at least some of the second vias passing through ones of the third wiring lines, some of the second vias passing through ones of the first wiring lines and some of second vias passing through ones of the first wiring lines.

11. A method of forming a semiconductor device including a multilayer wiring structure, comprising:

forming on a substrate a plurality of alternating overlying conductive layers and insulating layers, including at least three conductive layers and at least three insulating layers, wherein each of the conductive layers includes a plurality of conductive members;

forming a plurality of vias, including forming some of the vias through all of the insulating layers, such that ones of the conductive members of each conductive layer have at least one of the plurality of vias passing therethrough; and forming a metal interconnect within each of the plurality of vias.

12. The method of claim 11, wherein the forming a metal interconnect includes forming a metal interconnect within each of the plurality of vias by depositing a conductive material including tungsten or aluminum directly over and in contact with the surface of a last insulating layer and within the vias directly contacting walls of the vias.

* * * * *